United States Patent
Kurakata et al.

[11] Patent Number: 5,985,469
[45] Date of Patent: Nov. 16, 1999

[54] WHITE DECORATIVE PART AND PROCESS FOR PRODUCING THE SAME

[75] Inventors: Ryo Kurakata, Sayama; Yuji Fukazawa; Shinji Ikeda, both of Tokyo, all of Japan

[73] Assignee: Citizen Watch Co., Ltd., Japan

[21] Appl. No.: 08/949,673

[22] Filed: Oct. 14, 1997

Related U.S. Application Data

[63] Continuation of application No. 08/446,849, Jun. 2, 1995, abandoned.

[30] Foreign Application Priority Data

Dec. 28, 1993 [JP] Japan ..................................... 5-338645
Apr. 15, 1994 [JP] Japan ..................................... 6-077006

[51] Int. Cl.$^6$ .............................. B32B 15/04; C23C 14/06
[52] U.S. Cl. .......................... 428/627; 428/672; 428/938; 204/298.13
[58] Field of Search ..................................... 428/621, 627, 428/632, 672, 472, 469, 938; 204/298.13

[56] References Cited

U.S. PATENT DOCUMENTS

| | | | |
|---|---|---|---|
| 4,226,082 | 10/1980 | Nishida | 428/927 |
| 4,252,862 | 2/1981 | Nishida | 428/627 |
| 4,403,014 | 9/1983 | Bergmann | 428/621 |
| 4,699,850 | 10/1987 | Kishi et al. | 428/627 |
| 4,745,035 | 5/1988 | Savrer et al. | 428/672 |
| 4,791,017 | 12/1988 | Hofmann et al. | 428/469 |

FOREIGN PATENT DOCUMENTS

| | | |
|---|---|---|
| 60-141868 | 7/1985 | Japan . |
| 61-133379 | 6/1986 | Japan . |
| 63-125656 | 5/1988 | Japan . |
| 3-120355 | 5/1991 | Japan . |
| 4-141592 | 5/1992 | Japan . |

*Primary Examiner*—John J. Zimmerman
*Attorney, Agent, or Firm*—Webb Ziesenheim Logsdon Orkin & Hanson, P.C.

[57] ABSTRACT

A white decorative part comprising: a substrate, a white hard coating formed on the substrate according to a dry plating process, and an outermost coating formed on the white hard coating according to a dry plating process, wherein the white hard coating is composed of either a nitride, a carbide, an oxide or a carbonitride of at least one element selected from among Ti, Hf, Zr, Ta, V, Cr and Al or Ti, and wherein the outermost coating is composed of an alloy of gold and any of nickel, tantalum, cobalt, palladium, silver, rhodium, titanium and iron, the proportion of the gold to the outermost coating ranging from 30 to 80 atomic % while the proportion of the nickel, tantalum, cobalt, palladium, silver, rhodium, titanium or iron to the outermost coating ranges to 20 to 70 atomic %. Further, a process for producing the white decorative part. This white decorative part has a uniform white tone of high lightness and warmth, is excellent in the adhesion between the outermost coating and the substrate and ensures an appearance of superior quality. When the outermost coating is composed of a gold-titanium or gold-iron alloy, the white decorative part is free from causing any metal allergy to the skin.

9 Claims, No Drawings

WHITE DECORATIVE PART AND PROCESS FOR PRODUCING THE SAME

This application is a continuation of application Ser. No. 08/446,849 filed on Jun. 2, 1995, now abandoned.

TECHNICAL FIELD

The present invention relates to a white decorative part and a process for producing the same. More particularly, it is concerned with a white decorative part having an appearance of superiority quality which comprises an outermost coating having a white tone of high lightness and warmth formed according to a dry plating process, a white decorative part which can be mass-produced while stably maintaining the white tone of warmth and a process for producing the same.

Moreover, the present invention is concerned with a white decorative part whose danger of causing a metal-allergy-associated dermatitis such as a skin rash is strikingly less and a process for producing the same.

BACKGROUND ART

Conventionally, the white tone of the white decorative parts, for example, wristwatch parts, such as wristwatch bands, and spectacle frames is provided by forming a metal coating, such as a titanium carbide or platinum coating, as an outermost layer according to a wet or dry plating technique.

For example, in Japanese Patent Laid-open Publication No. 60(1985)-141868, a wristwatch armoring part is proposed which comprises a metal substrate, a phosphorus-containing nickel layer formed on the surface of the metal substrate by plating so as to have a thickness of 10 to 200 μm and hardened and a silvery white coating of titanium carbide or oxide formed on the surface of the nickel layer according to an ion plating process.

However, this titanium carbide coating formed on the surface of the wristwatch armoring part has a silvery white lacking both of lightness and warmth. Further, the production of this wristwatch armoring part has a drawback in that it is difficult to stably form a silvery white coating of titanium carbide or oxide.

The same applicant as in the present application proposed white personal ornaments (for example, spectacle frames and wristwatches) each comprising a surface layer of a platinum or platinum alloy coating in Japanese Patent Laid-open Publication No. 3(1991)-120355.

However, this platinum or platinum alloy coating of each of the white personal ornaments has a gray white giving an impression of coldness to the lookers and lacking warmth.

Therefore, in the art, there is a demand for the developments of a white decorative part having an appearance of superiority quality which comprises an outermost coating having a white tone of high lightness and warmth formed according to a dry plating process, a white decorative part which can be mass-produced while stably maintaining the white tone of warmth and a process for producing the same.

Some types of metals may cause a skin rash attributed to metal allergy. Therefore, there is also a demand in the art for the developments of a white decorative part free from the danger of causing metal allergy and a process for producing the same.

Accordingly, an object of the present invention is to provide a white decorative part having an appearance of superiority quality which comprises an outermost coating having a white tone of high lightness and warmth formed according to a dry plating process. Another object of the present invention is to provide a white decorative part having the above characteristics which does not cause dermatitis attributed to metal allergy.

A further object of the present invention is to provide a process for producing a white decorative part which can be mass-produced while stably maintaining the white tone of high lightness and warmth. Still a further object of the present invention is to provide a process for producing a white decorative part having the above characteristics which does not cause dermatitis attributed to metal allergy.

DISCLOSURE OF THE INVENTION

The white decorative part of the present invention comprises:

a substrate, a white hard coating formed on the substrate according to a dry plating process, and an outermost coating formed on the white hard coating according to a dry plating process, wherein the white hard coating is composed of either a nitride, a carbide, an oxide or a carbonitride of at least one element selected from among Ti, Hf, Zr, Ta, V, Cr and Al or Ti, and wherein the outermost coating is composed of a gold-nickel alloy, a gold-tantalum alloy, a gold-cobalt alloy, a gold-palladium alloy, a gold-silver alloy, a gold-rhodium alloy, a gold-titanium alloy or a gold-iron alloy, the proportion of the gold to the outermost coating ranging from 30 to 80 atomic % while the proportion of the nickel, tantalum, cobalt, palladium, silver, rhodium, titanium or iron to the outermost coating ranges to 20 to 70 atomic %.

When the outermost coating is composed of a gold-titanium alloy, a gold-iron alloy, a gold-nickel alloy, a gold-tantalum alloy, a gold-cobalt alloy or the like, it is preferred that each of the titanium, iron, nickel, tantalum, cobalt and the like which are contained in the outermost coating be in the form of a nitride, a carbide, an oxide or a carbonitride. If each of the above metals is in this form, a white decorative part having excellent light resistance can be obtained.

Further, the process for producing a white decorative part according to the present invention comprises:

evaporating at least one element selected from among Ti, Hf, Zr, Ta, V, Cr and Al in an atmosphere of argon gas, nitrogen gas, oxygen gas, a hydrocarbon gas or a gas of a mixture thereof in a dry plating apparatus to thereby form a white hard coating composed of either a nitride, a carbide, an oxide or a carbonitride thereof or Ti on a substrate, and subsequently evaporating in the dry plating apparatus a gold-nickel alloy or mixture, a gold-tantalum alloy or mixture, a gold-cobalt alloy or mixture, a gold-palladium alloy or mixture, a gold-silver alloy or mixture, a gold-rhodium alloy or mixture, a gold-titanium alloy or mixture or a gold-iron alloy or mixture in an atmosphere of argon gas to thereby form an outermost coating to which the proportion of the gold ranges from 30 to 80 atomic % while the proportion of the nickel, tantalum, cobalt, palladium, silver, rhodium, titanium or iron ranges from 20 to 70 atomic % on the white hard coating.

Prior to the formation of the white hard coating, a metal undercoating may be formed on the substrate according to a wet plating process.

BEST MODE FOR CARRYING OUT THE INVENTION

The white decorative part and the process for producing the same according to the present invention will be concretely described below.

First, the white decorative part of the present invention will be described.

The white decorative part of the present invention comprises:

a substrate, a white hard coating formed on the substrate according to the vacuum evaporation, sputtering or ion plating process as a dry plating process, and an outermost coating formed on the white hard coating according to the above dry plating process, wherein the outermost coating comprises gold and any of nickel, tantalum, cobalt, palladium, silver, rhodium, titanium and iron in specific proportions.

Although the material for composing the substrate for use in the present invention depends on the type of the decorative part, it may be selected from among, for example, metals such as stainless steel, titanium, titanium alloys and copper alloys, plastics and ceramics.

The white hard coating formed on the above substrate according to the dry plating process is composed of either a nitride, a carbide, an oxide or a carbonitride of at least one element selected from among Ti, Hf, Zr, Ta, V, Cr and Al or Ti.

With respect to the above nitride, nitrides having low nitrification degrees are preferred. When the nitrification degree of the nitride is too high, the white hard coating would have an intense golden tint. On the other hand, when the nitrification degree of the nitride is too low, the white hard coating would soften. Thus, it is preferred that the nitrification degree of the nitride be in the range of about 0.05 to 0.40, especially 0.15 to 0.25 in terms of x of $MN_x$ by which the metal nitride is represented.

With respect to the above carbide, carbides having low carbonization degrees are preferred. When the carbonization degree of the carbide is too high, the white hard coating would have an intense gray tint. On the other hand, when the carbonization degree of the carbide is too low, the white hard coating would soften. Thus, it is preferred that the carbonization degree of the carbide be in the range of about 0.05 to 0.40, especially 0.15 to 0.25 in terms of y of $MC_y$ by which the metal carbide is represented.

With respect to the above oxide, oxides having low oxidization degrees are preferred. When the oxidization degree of the oxide is too high, the white hard coating would have, for example, an intense gray or blue tint. On the other hand, when the oxidization degree of the oxide is too low, the white hard coating would soften. Thus, it is preferred that the oxidization degree of the oxide be in the range of about 0.05 to 0.40, especially 0.15 to 0.25 in terms of z of $MO_z$ by which the metal oxide is represented.

With respect to the above carbonitride, carbonitrides having low carbonitrification degrees are preferred. As in the above nitride, when the carbonitrfication degree of the carbonitride is too high, the white hard coating would have, for example, an intense golden, orangy or gray tint. On the other hand, when the carbonitrification degree of the carbonitride is too low, the white hard coating would soften. Thus, it is preferred that the carbonitrification degree of the carbonitride be in the range of about 0.05 to 0.40, especially 0.15 to 0.25 in terms of x+y of $MN_xC_y$ by which the metal carbonitride is represented.

In the present invention, preferred use is made of the nitrides of Ti, Hf, Zr, Ta, V, Cr and Al, especially the nitride of Ti, having the above nitrification degrees.

The thickness of the white hard coating is generally in the range of 0.1 to 10 μm, preferably 0.1 to 2 μm.

Although the white hard coating may be omitted from the white decorative part, the formation of the white hard coating on the substrate is preferred from the viewpoint of the abrasion and corrosion resistances.

When the substrate is composed of a material having poor corrosion resistance such as brass, German silver, bronze or a zinc alloy, it is preferred in the present invention that a metal undercoating be disposed between the substrate and the white hard coating.

The metal undercoating may be at least one member selected from the group consisting of a nickel alloy coating, a nickel coating, a chromium coating, a palladium coating, a laminate of nickel alloy and chromium coatings, a laminate of nickel and chromium coatings, a laminate of nickel alloy and palladium coatings, a laminate of nickel and palladium coatings, a copper-tin alloy coating and a copper-tin-palladium alloy coating. Of these, a copper-tin alloy coating and a copper-tin-palladium alloy coating are preferred.

The metal undercoating is formed on the above substrate according to a wet plating process. Specifically, the formation of the metal undercoating on the substrate is conducted with the use of a plating solution containing ions of the metal constituting the metal undercoating. In the formation of the metal undercoating, the wet plating process is preferred to the dry plating process because the productivity is high and because a metal undercoating of constant quality can be obtained.

In particular, the nickel alloy coating may be, for example, a nickel-phosphorus alloy coating, a nickel-palladium alloy coating, a nickel-boron alloy coating or a nickel-tin alloy coating.

When the substrate is composed of a material having poor corrosion resistance such as a copper alloy, a palladium coating is suitably formed on the substrate. On the other hand, when the substrate requires abrasion resistance, a chromium coating is suitably formed on the substrate. However, if the chromium plating cannot be employed due to the problem of waste water treatment, etc., a nickel plating may be effected instead to thereby form a nickel coating.

When the white decorative part is put to use in which the corrosion resistance is important, a palladium coating of, for example, 0.5 to 5 μm in thickness may be superimposed on a nickel alloy or nickel coating of, for example, 3 to 10 μm in thickness to further improve the corrosion resistance. Moreover, when the high hardness is desired together with the abrasion resistance, a chromium coating of 0.3 to 7.0 μm in thickness may be superimposed on a nickel alloy or nickel coating of, for example, 3 to 10 μm in thickness to thereby ensure production of a white decorative part of high hardness and excellent abrasion resistance at a relatively lowered cost.

Although the thickness of the above metal undercoating is not particularly limited, it is generally in the range of 3 to 30 μm, though depending on the type of the coating, when the metal undercoating is composed of one layer.

The outermost coating formed on the white hard coating according to the dry plating process is composed of a gold-nickel alloy, a gold-tantalum alloy, a gold-cobalt alloy, a gold-palladium alloy, a gold-silver alloy, a gold-rhodium alloy, a gold-titanium alloy or a gold-iron alloy. A gold-nickel alloy, a gold-titanium alloy and a gold-iron alloy are preferred in the present invention.

A white decorative part whose danger of causing metal allergy is extremely less can be obtained by the use of a gold-titanium alloy or a gold-iron alloy in the outermost coating.

In the above outermost coating composed of a gold alloy, the gold is contained in a proportion of 30 to 80 atomic %, preferably 50 to 79.5 atomic % and still preferably 70 to 79 atomic % while the nickel, tantalum, cobalt, palladium, silver, rhodium, titanium or iron is contained in a proportion of 20 to 70 atomic %, preferably 20.5 to 50 atomic % and still preferably 21 to 30 atomic %.

When the outermost coating is composed of a gold-nickel alloy, a gold-tantalum alloy, a gold-cobalt alloy, a gold-titanium alloy or a gold-iron alloy, the nickel, tantalum, cobalt, titanium or iron may be in the form of a nitride, a carbide, an oxide or a carbonitride.

In particular, when the outermost coating is composed of a gold-titanium alloy, it is preferred to be a coating of a mixture of gold and a nitride, a carbide, an oxide or a carbonitride of titanium. This would lead to production of a white decorative part having excellent light resistance.

When the outermost coating is composed of a gold-iron alloy, it is preferred to be a coating of a mixture of gold and a nitride, a carbide, an oxide or a carbonitride of iron. This would also lead to production of a white decorative part having excellent light resistance.

When the outermost coating contains gold and any of nickel, tantalum, cobalt, palladium, silver, rhodium, titanium and iron in the above proportions, a white decorative part can be obtained which is highly light and has a white uniform tone with warmth. Outermost coatings composed of gold and any of nickel, titanium and iron are especially preferred in the present invention. In particular, when titanium or iron is contained in the above proportion, the resultant outermost coating is highly light and its danger of causing metal allergy is extremely less.

The white tone of the above white decorative part of the present invention in respect of the specular gloss is generally at least 40, preferably at least 50, still preferably from 60 to 100 and further still preferably from 70 to 100 in terms of L* (lightness index of CIE 1976 (L*a*b*) of International Illumination Committee (CIE)). Preferably, a* ranges from −10 to +10 and also b* from −10 to +10.

The outermost coating of the white decorative part according to the present invention has a thickness ranging generally from 0.05 to 0.5 μm, preferably from 0.1 to 0.3 μm.

The condition of the surface of the outermost coating of the white decorative part of the present invention is not particularly limited. It may have specular gloss or matte finish.

The white decorative part of the present invention has excellent light resistance and little discolors even if exposed to the sunlight.

Now, the process for producing the white decorative part according to the present invention will be described.

First, the white decorative part composed of a substrate, a white hard coating and an outermost coating may be produced a process comprising:

evaporating at least one element selected from among Ti, Hf, Zr, Ta, V, Cr and Al in an atmosphere of argon gas, nitrogen gas, an oxygen gas, a hydrocarbon gas or a gas of a mixture thereof in a dry plating apparatus to thereby form a white hard coating composed of either a nitride, a carbide, an oxide or a carbonitride thereof or Ti on a substrate, and subsequently forming an outermost coating comprising 30 to 80 atomic % of gold and 20 to 70 atomic % of any of nickel, tantalum, cobalt, palladium, silver, rhodium, titanium and iron on the white hard coating in an atmosphere of argon in the dry plating apparatus.

The white decorative part having no white hard coating on the substrate, i.e., the white decorative part composed of the substrate and the outermost coating is obtained by forming an outermost coating comprising 30 to 80 atomic % of gold and 20 to 70 atomic % of any of nickel, tantalum, cobalt, palladium, silver, rhodium, titanium and iron on the substrate in an atmosphere of argon in a dry plating apparatus.

In the present invention, the outermost coating may be formed according to the sputtering, vacuum evaporation or ion plating process. The formation thereof according to the ion plating process is especially preferred.

The metal undercoating which may be interposed between the substrate of, for example, brass having poor corrosion resistance and the white hard coating may be formed according to, for example, the following wet plating process.

A nickel-phosphorus alloy coating of 0.5 to 5 μm in thickness is formed on the substrate by, for example, electroless nickel-phosphorus alloy plating. Suitably employed plating bath composition and plating conditions are, for example, as follows:

Nickel-phosphorus alloy plating

| Plating bath composition | |
|---|---|
| nickel sulfate | 20 g/liter |
| sodium hypophosphite | 25 g/liter |
| lactic acid | 25 g/liter |
| propionic acid | 3 g/liter |
| Plating conditions | |
| pH | 11 4 to 5 |
| temperature | 90° C. |

Aging may be conducted after the above formation of the nickel-phosphorus alloy coating on the substrate. The aging is generally conducted at 400 to 500° C. for 30 to 60 min.

The white decorative part of the present invention is obtained by successively forming the white hard coating and the outermost coating on the thus formed metal undercoating according to the above processes. Also, another metal undercoating may be formed on the thus obtained metal undercoating according to, for example, the following wet plating process.

A chromium coating of 0.5 to 5 μm in thickness as another metal undercoating may be formed according to a wet plating process on the nickel-phosphorus alloy coating of 0.5 to 5 μm in thickness formed on the substrate by, for example, the above wet plating process. Suitably employed plating bath composition and plating conditions are, for example, as follows:

Chromium plating

| Plating bath composition | |
|---|---|
| chromic anhydride | 200 to 300 g/liter |
| sulfuric acid | 2 to 3 g/liter |
| trivalent chromium | 1 to 5 g/liter |
| Plating conditions | |
| bath temperature | 40 to 55° C. |
| current density | 10 to 60 A/dm$^2$ |

The decorative chromium plating and industrial chromium plating methods are available for the formation of the chromium coating. The chromium coating for use in the present invention may be formed by either of the methods.

The white decorative part composed of the substrate, the double metal undercoating, the white hard coating and the outermost coating is obtained by successively forming the white hard coating and the outermost coating on the thus formed metal undercoating according to the above processes.

The formation of the white hard coating and outermost coating of the white decorative part of the present invention according to the ion plating process will be described in greater detail below.

The substrate such as a wristwatch band is preferably washed with an organic solvent in advance. The interior of the ion plating apparatus is evacuated to $5 \times 10^{-5}$ to $1.0 \times 10^{-6}$ Torr, preferably $1.0 \times 10^{-5}$ to $1.0 \times 10^{-6}$ Torr.

For obtaining a uniform white hard coating, it is preferred that the pressure of the interior of the ion plating apparatus be low before the coating formation. Preferably, the interior of the apparatus is evacuated to $1 \times 10^{-5}$ Torr or less.

Subsequently, the above white hard coating composed of a Ti nitride of low nitrification degree is formed.

Although in the present invention the formation of the white hard coating composed of a Ti nitride of low nitrification degree is preferred from the viewpoint of the adhesion between the substrate and the outermost coating composed of any of a gold-nickel alloy, a gold-tantalum alloy, a gold-cobalt alloy, a gold-palladium alloy, a gold-silver alloy, a gold-rhodium alloy, a gold-titanium alloy or a gold-iron alloy, the above white hard coating may be replaced by a white hard coating composed of a carbide, an oxide or a carbonitride of Ti, a nitride, a carbide, an oxide or a carbonitride of Hf, Zr, Ta, V, Cr or Al or Ti per se.

Then, the interior of the ion plating apparatus is evacuated to $5 \times 10^{-5}$ to $1.0 \times 10^{-6}$ Torr, preferably $1.0 \times 10^{-5}$ to $1.0 \times 10^{-6}$ Torr. Thereafter, an atmosphere gas such as argon gas is introduced to $8 \times 10^{-4}$ to $6 \times 10^{-3}$ Torr, preferably $1.0 \times 10^{-3}$ to $3.0 \times 10^{-3}$ Torr.

Now, the above white coating of a gold alloy is formed.

The vapor source for use in the present invention may be a gold-nickel alloy having a nickel content of 25 to 70 atomic %, a gold-tantalum alloy having a tantalum content of 60 to 90 atomic %, a gold-cobalt alloy having a cobalt content of 25 to 70 atomic %, a gold-palladium alloy having a palladium content of 20 to 70 atomic %, a gold-silver alloy having a silver content of 15 to 60 atomic %, a gold-rhodium alloy having a rhodium content of 40 to 80 atomic %, a gold-titanium alloy having a titanium content of 40 to 80 atomic % or a gold-iron alloy having an iron content of 40 to 80 atomic %.

Further, in the present invention, the vapor source may be a gold-nickel mixture, a gold-tantalum mixture, a gold-cobalt mixture, a gold-palladium mixture, a gold-silver mixture, a gold-rhodium mixture, a gold-titanium mixture or a gold-iron mixture. Still further, the apparatus may be provided with two vapor sources, the one being gold while the other being another metal such as nickel, to thereby separately evaporate gold and the other metal.

The tone of the outermost coating of the obtained white decorative part can easily be controlled by regulating the proportion of gold to the other metal such as nickel in the vapor source.

Ion plating has been conducted with an ionic current of 1 to 15 A, depending on the type and content of the metal other than gold. When the other metal is Ti or Fe, it is preferred that the ionic current range from 1 to 10 A, especially from 5 to 10 A. When the ionic current is less than 1 A, some products would have poor light resistance. On the other hand, when the ionic current exceeds 10 A, some products would suffer from discoloration at the coating formation.

In the formation of an outermost coating of, for example, a gold-iron alloy (the iron of the alloy may be in the form of a nitride, a carbide, a carbonitride or an oxide), the relationship of the light resistance of the gold-iron alloy (any discoloration in the light resistance test described below) and varied ionic currents is as follows.

| Alloy composition | Ionic current | | | | |
| --- | --- | --- | --- | --- | --- |
|  | below 1 A | 1 to 2 A | 2 to 5 A | 5 to 10 A | over 10 A |
| Fe: over 50 at. % | discol. at light resist test | discol. | discol. | no discol. | discol. at coating formation |
| Fe: 30 to 50 at. % | discol. at light resist test | discol. | no discol. | no discol. | discol. at coating formation |
| Fe: below 30 at. % | discol. at light resist test | no discol. | no discol. | no discol. | no discol. | at. % = atomic %, discol. = discolored, no discol. = no discolored

The light resistance test was carried out in the following manner.

Instrument: Due Cycle Super Long Life Weather Meter (model WEL-SUN-DC) manufactured by Suga Test Instruments Co., Ltd. Light source: artificial sunlight, carbon arc light. Test conditions: dry, continuously exposed for 100 hr.

The terminology "discolored" employed in the above light resistance test means the change of the outermost coating by exposure to light such as one from (L*85, a*1.5, b*4.0) prior to the exposure to (L*55, a*8.0, b*22.0) after the exposure.

The condition of iron, as an example of the metal other than gold, contained in the outermost coating has been analyzed by the use of X-ray photoelectron spectroscopy (ESCA-850 manufactured by Shimadzu Corporation). As a result, it has been found that the proportion of iron being present in the form of a metal is high in an outermost coating prepared with low ionic current and having exhibited a discoloration in the light resistance test while iron is predominantly present in the form of an oxide in an outermost coating prepared with high ionic current and having exhibited no discoloration in the light resistance test.

As apparent from the above, especially in the outermost coating of a gold-titanium or gold-iron alloy, it is preferred that the titanium or iron be in the form of a nitride, a carbide, an oxide or a carbonitride. This gold-titanium or gold-iron alloy would be formed by the reaction of the titanium or iron with nitrogen, carbon or oxygen (inevitable ingredients) remaining in the ion plating apparatus.

In the present invention, the outermost coating may also be formed by the sputtering or vacuum evaporation process. The presence of titanium or iron of the gold-titanium or gold-iron alloy composing the outermost coating in the form of a nitride, a carbide, a carbonitride or an oxide can be ensured by carrying out the sputtering or vacuum evaporation in an apparatus in which nitrogen gas, oxygen gas, hydrocarbon gas or the like is introduced together with argon gas. For example, when an outermost coating of a gold-iron alloy (the iron of the alloy being in the form of a nitride, a carbide, a carbonitride or an oxide) is formed, it is preferred that the gas of the following composition be employed.

| Alloy | Proportion of gas | | |
|---|---|---|---|
| composition | $N_2$/Ar | $O_2$/Ar | $C_2H$/Ar |
| Fe: over 50 at. % | 20/100–40/100 | 2/100–4/100 | 6/100–10/100 |
| Fe: 30 to 50 at. % | 10/100–20/100 | 1/100–2/100 | 3/100–6/100 |
| Fe: below 30 at. % | 5/100–10/100 | 0.5/100–1/100 | 1/100–3/100 | at. % = atomic %

EFFECT OF THE INVENTION

The white decorative part of the present invention comprises: a substrate, a white hard coating formed on the substrate according to a dry plating process, and an outermost coating formed on the white hard coating according to a dry plating process, wherein the white hard coating is composed of either a nitride, a carbide, an oxide or a carbonitride of at least one element selected from among Ti, Hf, Zr, Ta, V, Cr and Al or Ti, and wherein the outermost coating is composed of a gold-nickel alloy, a gold-tantalum alloy, a gold-cobalt alloy, a gold-palladium alloy, a gold-silver alloy, a gold-rhodium alloy, a gold-titanium alloy or a gold-iron alloy, the gold and the nickel, tantalum, cobalt, palladium, silver, rhodium, titanium or iron being contained in specified proportions. This white decorative part has a uniform white tone of high lightness and warmth, is excellent in the adhesion between the outermost coating and the substrate and ensures an appearance of superior quality. An outermost coating having improved abrasion resistance can be obtained by the formation thereof according to the ion plating process. Especially, when the outermost coating is composed of a gold-titanium or gold-iron alloy, a white decorative part can be obtained which not only has the above characteristics but also is free from causing any metal allergy.

Moreover, outermost coatings each composed of an alloy (mixed coating) of gold and any of a nitride, a carbide, an oxide and a carbonitride of titanium or an alloy (mixed coating) of gold and any of a nitride, a carbide, an oxide and a carbonitride of iron exhibit excellent light resistance.

Further, the process for producing a white decorative part according to the present invention ensures mass-production of the above white decorative part while stably maintaining the white tone of high lightness and warmth. Especially, when the outermost coating is composed of a gold-titanium or gold-iron alloy, a white decorative part can be obtained which not only has the above characteristics but also is free from causing any metal allergy.

The present invention will be further illustrated below with reference to the following Examples, which should not be construed as limiting the scope of the invention.

EXAMPLE 1

A wristwatch case of stainless steel was washed with an organic solvent and disposed in an ion plating apparatus.

Subsequently, the interior of the apparatus was evacuated to a pressure of $1.0 \times 10^{-5}$ Torr, and argon gas was introduced thereinto to a pressure of $3.0 \times 10^{-3}$ Torr.

Then, a thermionic filament and a plasma electrode arranged in the apparatus were operated to generate argon plasma. Simultaneously, a voltage of −50 V was applied to the wristwatch case as a substrate, and bombardment cleaning was performed for 10 min.

The introduction of argon gas was halted, and nitrogen gas was introduced into the apparatus to a pressure of $1.0 \times 10^{-3}$ Torr. A plasma gun disposed in the apparatus was operated to generate plasma, and titanium was evaporated for 10 min, thereby forming a 0.5 μm thick coating of a Ti nitride having a nitrification degree of 0.2 in terms of the above defined x on the surface of the wristwatch case. Thereafter, the interior of the apparatus was evacuated to a pressure of $1.0 \times 10^{-5}$ Torr.

Then, argon gas was introduced into the apparatus to a pressure of $1.0 \times 10^{-3}$ Torr, and plasma was generated. A gold-nickel mixture composed of 55 atomic % of gold and 45 atomic % of nickel was evaporated until a gold-nickel alloy coating having a thickness of 0.3 μm was formed.

The thus obtained wristwatch case had a uniform white tone of high lightness and warmth.

The outermost coating of the obtained wristwatch case was analyzed by X-ray photoelectron spectroscopy, and it was found that the outermost coating was composed of 63 atomic % of gold and 37 atomic % of nickel.

A 0.5 μm thick coating of a Ti nitride and thereupon a 0.3 μm thick coating of a gold-nickel alloy were formed on a stainless steel plate in the same manner as described above, except that the stainless steel plate composed of stainless steel of the same quality as that of the stainless steel composing the above wristwatch case was used in place of the wristwatch case. The lightness (L*) of the white tone thereof was measured.

The L* of the white tone was 65.

The above measurement of the lightness (L*) of the white tone was performed with respect to a specimen with specular gloss by the use of SM color computer (item number SM-4 manufactured by Suga Test Instruments Co., Ltd.).

The evaluated lightness of the white tone of the specimen was expressed as a comparative value relative to 100 assigned to the lightness of the standard white tone sample of Suga Test Instruments Co., Ltd. As a result, the numeric value of the lightness obtained by the above measurement is slightly different from that of the lightness based on the Munsell lightness table.

EXAMPLE 2

A wristwatch case of stainless steel was washed with an organic solvent and disposed in an ion plating apparatus.

Subsequently, the interior of the apparatus was evacuated to a pressure of $1.0 \times 10^{-5}$ Torr, and argon gas was introduced thereinto to a pressure of $3.0 \times 10^{-3}$ Torr. Then, a thermionic filament and a plasma electrode arranged in the apparatus were operated to generate argon plasma. Simultaneously, a voltage of −50 V was applied to the wristwatch case as a substrate, and bombardment cleaning was performed for 10 min.

The introduction of argon gas was halted, and a mixture of nitrogen and ethylene gases was introduced into the apparatus to a pressure of $2.0 \times 10^{-3}$ Torr. A plasma gun disposed in the apparatus was operated to generate plasma, and titanium was evaporated for 10 min, thereby forming a 0.5 μm thick coating of a Ti carbonitride having a carbonitrification degree of 0.3 in terms of the above defined x+y on the surface of the wristwatch case. Thereafter, the interior of the apparatus was evacuated to a pressure of $1.0 \times 10^{-5}$ Torr.

Then, argon gas was introduced into the apparatus to a pressure of $1.0 \times 10^{-3}$ Torr, and plasma was generated. A gold-nickel alloy composed of 45 atomic % of gold and 55 atomic % of nickel was evaporated until a gold-nickel alloy coating having a thickness of 0.3 μm was formed.

The thus obtained wristwatch case had a uniform white tone of high lightness and warmth.

The outermost coating of the obtained wristwatch case was analyzed by X-ray photoelectron spectroscopy, and it was found that the outermost coating was composed of 55 atomic % of gold and 45 atomic % of nickel.

A 0.5 μm thick coating of a Ti carbonitride and thereupon a 0.3 μm thick coating of a gold-nickel alloy were formed on a stainless steel plate in the same manner as described above, except that the stainless steel plate composed of stainless steel of the same quality as that of the stainless steel composing the above wristwatch case was used in place of the wristwatch case. The lightness (L*) of the white tone thereof was measured.

The L* of the white tone was 45.

EXAMPLE 3

A wristwatch case of stainless steel was washed with an organic solvent and disposed in an ion plating apparatus.

Subsequently, the interior of the apparatus was evacuated to a pressure of $1.0 \times 10^{-5}$ Torr, and argon gas was introduced thereinto to a pressure of $3.0 \times 10^{-3}$ Torr.

Then, a thermionic filament and a plasma electrode arranged in the apparatus were operated to generate argon plasma. Simultaneously, a voltage of −50 V was applied to the wristwatch case as a substrate, and bombardment cleaning was performed for 10 min.

The introduction of argon gas was halted, and ethylene gas was introduced into the apparatus to a pressure of $1.5 \times 10^{-3}$ Torr. A plasma gun disposed in the apparatus was operated to generate plasma, and Ti was evaporated for 10 min, thereby forming a 0.5 μm thick coating of a Ti carbide having a carbonization degree of 0.25 in terms of the above defined y on the surface of the wristwatch case. Thereafter, the interior of the apparatus was evacuated to a pressure of $1.0 \times 10^{-5}$ Torr.

Then, argon gas was introduced into the apparatus to a pressure of $1.0 \times 10^{-3}$ Torr, and plasma was generated. A gold-nickel alloy composed of 55 atomic % of gold and 45 atomic % of nickel was evaporated until a gold-nickel alloy coating having a thickness of 0.3 μm was formed.

The thus obtained wristwatch case had a uniform white tone of high lightness and warmth.

The outermost coating of the obtained wristwatch case was analyzed by X-ray photoelectron spectroscopy, and it was found that the outermost coating was composed of 63 atomic % of gold and 37 atomic % of nickel.

A 0.5 μm thick coating of a Ti carbide and thereupon a 0.3 μm thick coating of a gold-nickel alloy were formed on a stainless steel plate in the same manner as described above, except that the stainless steel plate composed of stainless steel of the same quality as that of the stainless steel composing the above wristwatch case was used in place of the wristwatch case. The lightness (L*) of the white tone thereof was measured.

The L* of the white tone was 65.

EXAMPLE 4

A wristwatch case of stainless steel was washed with an organic solvent and disposed in an ion plating apparatus.

Subsequently, the interior of the apparatus was evacuated to a pressure of $1.0 \times 10^{-5}$ Torr, and argon gas was introduced thereinto to a pressure of $3.0 \times 10^{-3}$ Torr.

Then, a thermionic filament and a plasma electrode arranged in the apparatus were operated to generate argon plasma. Simultaneously, a voltage of −50 V was applied to the wristwatch case as a substrate, and bombardment cleaning was performed for 10 min.

A plasma gun disposed in the apparatus was operated to generate plasma, and Ti was evaporated for 10 min, thereby forming a 0.5 μm thick coating of Ti on the surface of the wristwatch case. Thereafter, the interior of the apparatus was evacuated to a pressure of $1.0 \times 10^{-5}$ Torr.

Then, argon gas was introduced into the apparatus to a pressure of $1.0 \times 10^{-3}$ Torr, and plasma was generated. A gold-nickel mixture composed of 45 atomic % of gold and 55 atomic % of nickel was evaporated until a gold-nickel alloy coating having a thickness of 0.3 μm was formed.

The thus obtained wristwatch case had a uniform white tone of high lightness and warmth.

The outermost coating of the obtained wristwatch case was analyzed by X-ray photoelectron spectroscopy, and it was found that the outermost coating was composed of 55 atomic % of gold and 45 atomic % of nickel.

A 0.5 μm thick coating of Ti and thereupon a 0.3 μm thick coating of a gold-nickel alloy were formed on a stainless steel plate in the same manner as described above, except that the stainless steel plate composed of stainless steel of the same quality as that of the stainless steel composing the above wristwatch case was used in place of the wristwatch case. The lightness (L*) of the white tone thereof was measured.

The L* of the white tone was 45.

EXAMPLE 5

A wristwatch case of stainless steel was washed with an organic solvent and disposed in an ion plating apparatus.

Subsequently, the interior of the apparatus was evacuated to a pressure of $1.0 \times 10^{-5}$ Torr, and argon gas was introduced thereinto to a pressure of $3.0 \times 10^{-3}$ Torr.

Then, a thermionic filament and a plasma electrode arranged in the apparatus were operated to generate argon plasma. Simultaneously, a voltage of −50 V was applied to the wristwatch case as a substrate, and bombardment cleaning was performed for 10 min.

The introduction of argon gas was halted, and nitrogen gas was introduced into the apparatus to a pressure of $1.0 \times 10^{-3}$ Torr. A plasma gun disposed in the apparatus was operated to generate plasma, and Ti was evaporated for 10 min, thereby forming a 0.5 μm thick coating of a Ti nitride having a nitrification degree of 0.2 in terms of the above defined x on the surface of the wristwatch case. Thereafter, the interior of the apparatus was evacuated to a pressure of $1.0 \times 10^{-5}$ Torr.

Then, argon gas was introduced into the apparatus to a pressure of $1.0 \times 10^{-3}$ Torr, and plasma was generated. A gold-cobalt mixture composed of 55 atomic % of gold and 45 atomic % of cobalt was evaporated until a gold-cobalt alloy coating having a thickness of 0.3 μm was formed.

The thus obtained wristwatch case had a uniform white tone of high lightness and warmth.

The outermost coating of the obtained wristwatch case was analyzed by X-ray photoelectron spectroscopy, and it was found that the outermost coating was composed of 65 atomic % of gold and 35 atomic % of cobalt.

A 0.5 μm thick coating of a Ti nitride and thereupon a 0.3 μm thick coating of a gold-cobalt alloy were formed on a stainless steel plate in the same manner as described above, except that the stainless steel plate composed of stainless steel of the same quality as that of the stainless steel composing the above wristwatch case was used in place of the wristwatch case. The lightness (L*) of the white tone thereof was measured.

The L* of the white tone was 68.

EXAMPLE 6

A wristwatch case of stainless steel was washed with an organic solvent and disposed in an ion plating apparatus.

Subsequently, the interior of the apparatus was evacuated to a pressure of $1.0 \times 10^{-5}$ Torr, and argon gas was introduced thereinto to a pressure of $3.0 \times 10^{-3}$ Torr.

Then, a thermionic filament and a plasma electrode arranged in the apparatus were operated to generate argon plasma. Simultaneously, a voltage of −50 V was applied to the wristwatch case as a substrate, and bombardment cleaning was performed for 10 min.

The introduction of argon gas was halted, and a mixture of nitrogen and ethylene gases was introduced into the apparatus to a pressure of $2.0 \times 10^{-3}$ Torr. A plasma gun disposed in the apparatus was operated to generate plasma, and Ti was evaporated for 10 min, thereby forming a 0.5 μm thick coating of a Ti carbonitride having a carbonitrification degree of 0.3 in terms of the above defined x+y on the surface of the wristwatch case. Thereafter, the interior of the apparatus was evacuated to a pressure of $1.0 \times 10^{-5}$ Torr.

Then, argon gas was introduced into the apparatus to a pressure of $1.0 \times 10^{-3}$ Torr, and plasma was generated. A gold-cobalt alloy composed of 45 atomic % of gold and 55 atomic % of cobalt was evaporated until a gold-cobalt alloy coating having a thickness of 0.3 μm was formed.

The thus obtained wristwatch case had a uniform white tone of high lightness and warmth.

The outermost coating of the obtained wristwatch case was analyzed by X-ray photoelectron spectroscopy, and it was found that the outermost coating was composed of 59 atomic % of gold and 41 atomic % of cobalt.

A 0.5 μm thick coating of a Ti carbonitride and thereupon a 0.3 μm thick coating of a gold-cobalt alloy were formed on a stainless steel plate in the same manner as described above, except that the stainless steel plate composed of stainless steel of the same quality as that of the stainless steel composing the above wristwatch case was used in place of the wristwatch case. The lightness (L*) of the white tone thereof was measured.

The L* of the white tone was 50.

EXAMPLE 7

A wristwatch case of stainless steel was washed with an organic solvent and disposed in an ion plating apparatus.

Subsequently, the interior of the apparatus was evacuated to a pressure of $1.0 \times 10^{-5}$ Torr, and argon gas was introduced thereinto to a pressure of $3.0 \times 10^{-3}$ Torr.

Then, a thermionic filament and a plasma electrode arranged in the apparatus were operated to generate argon plasma. Simultaneously, a voltage of −50 V was applied to the wristwatch case as a substrate, and bombardment cleaning was performed for 10 min.

The introduction of argon gas was halted, and ethylene gas was introduced into the apparatus to a pressure of $1.5 \times 10^{-3}$ Torr. A plasma gun disposed in the apparatus was operated to generate plasma, and Ti was evaporated for 10 min, thereby forming a 0.5 μm thick coating of a Ti carbide having a carbonization degree of 0.25 in terms of the above defined y on the surface of the wristwatch case. Thereafter, the interior of the apparatus was evacuated to a pressure of $1.0 \times 10^{-5}$ Torr.

Then, argon gas was introduced into the apparatus to a pressure of $1.0 \times 10^{-3}$ Torr, and plasma was generated. A gold-cobalt alloy composed of 55 atomic % of gold and 45 atomic % of cobalt was evaporated until a gold-cobalt alloy coating having a thickness of 0.3 μm was formed.

The thus obtained wristwatch case had a uniform white tone of high lightness and warmth.

The outermost coating of the obtained wristwatch case was analyzed by X-ray photoelectron spectroscopy, and it was found that the outermost coating was composed of 65 atomic % of gold and 35 atomic % of cobalt.

A 0.5 μm thick coating of a Ti carbide and thereupon a 0.3 μm thick coating of a gold-cobalt alloy were formed on a stainless steel plate in the same manner as described above, except that the stainless steel plate composed of stainless steel of the same quality as that of the stainless steel composing the above wristwatch case was used in place of the wristwatch case. The lightness (L*) of the white tone thereof was measured.

The L* of the white tone was 68.

EXAMPLE 8

A wristwatch case of stainless steel was washed with an organic solvent and disposed in an ion plating apparatus.

Subsequently, the interior of the apparatus was evacuated to a pressure of $1.0 \times 10^{-5}$ Torr, and argon gas was introduced thereinto to a pressure of $3 \times 10^{-3}$ Torr.

Then, a thermionic filament and a plasma electrode arranged in the apparatus were operated to generate argon plasma. Simultaneously, a voltage of −50 V was applied to the wristwatch case as a substrate, and bombardment cleaning was performed for 10 min.

A plasma gun disposed in the apparatus was operated to generate plasma, and Ti was evaporated for 10 min, thereby forming a 0.5 μm thick coating of Ti on the surface of the wristwatch case. Thereafter, the interior of the apparatus was evacuated to a pressure of $1.0 \times 10^{-5}$ Torr.

Then, argon gas was introduced into the apparatus to a pressure of $1.0 \times 10^{-3}$ Torr, and plasma was generated. A gold-cobalt mixture composed of 45 atomic % of gold and 55 atomic % of cobalt was evaporated until a gold-cobalt alloy coating having a thickness of 0.3 μm was formed.

The thus obtained wristwatch case had a uniform white tone of high lightness and warmth.

The outermost coating of the obtained wristwatch case was analyzed by X-ray photoelectron spectroscopy, and it was found that the outermost coating was composed of 59 atomic % of gold and 41 atomic % of cobalt.

A 0.5 μm thick coating of Ti and thereupon a 0.3 μm thick coating of a gold-cobalt alloy were formed on a stainless steel plate in the same manner as described above, except that the stainless steel plate composed of stainless steel of the same quality as that of the stainless steel composing the above wristwatch case was used in place of the wristwatch case. The lightness (L*) of the white tone thereof was measured.

The L* of the white tone was 50.

EXAMPLE 9

A wristwatch case of brass being a copper alloy was washed with an alkali and neutralized with an acid. Then, a 0.5 to 1.0 μm thick coating of a nickel-phosphorus alloy as a metal undercoating was formed on the surface thereof according to the electroless nickel-phosphorus alloy plating process. The employed plating bath composition and plating conditions were as follows:

Nickel-phosphorus alloy plating

Plating bath composition

| nickel sulfate | 20 g/liter |
| --- | --- |
| sodium hypophosphite | 25 g/liter |
| lactic acid | 25 g/liter |
| propionic acid | 3 g/liter |
| Plating conditions | |
| pH | 4 to 5 |
| temperature | 90° C. |

Subsequently, the resultant wristwatch case was placed in an ion plating apparatus. The interior of the apparatus was evacuated to a pressure of $1.0 \times 10^{-5}$ Torr, and argon gas was introduced thereinto to a pressure of $3 \times 10^{-3}$ Torr.

Then, a thermionic filament and a plasma electrode arranged in the apparatus were operated to generate argon plasma. Simultaneously, a voltage of −50 V was applied to the wristwatch case as a substrate, and dombardment cleaning was performed for 10 min.

The introduction of argon gas was halted, and nitrogen gas was introduced into the apparatus to a pressure of $1.0 \times 10^{-3}$ Torr. A plasma gun disposed in the apparatus was operated to generate plasma, and Ti was evaporated for 10 min, thereby forming a 0.5 μm thick coating of a Ti nitride having a nitrification degree of 0.2 in terms of the above defined x on the surface of the nickel-phosphorus alloy coating. Thereafter, the interior of the apparatus was evacuated to a pressure of $1.0 \times 10^{-5}$ Torr.

Then, argon gas was introduced into the apparatus to a pressure of $1.0 \times 10^{-3}$ Torr, and plasma was generated. A gold-nickel mixture composed of 55 atomic % of gold and 45 atomic % of nickel was evaporated until a gold-nickel alloy coating having a thickness of 0.3 μm was formed.

The thus obtained wristwatch case had a uniform white tone of high lightness and warmth.

The outermost coating of the obtained wristwatch case was analyzed by X-ray photoelectron spectroscopy, and it was found that the outermost coating was composed of 63 atomic % of gold and 37 atomic % of nickel.

A 0.5 to 1.0 μm thick coating of a nickel-phosphorus alloy, a 0.5 μm thick coating of a Ti nitride and a 0.3 μm thick coating of a gold-nickel alloy in this order were formed on a brass plate in the same manner as described above, except that the brass plate composed of brass of the same quality as that of the brass composing the above wristwatch case was used in place of the wristwatch case. The lightness (L*) of the white tone thereof was measured.

The L* of the white tone was 65.

EXAMPLE 10

A 0.5 to 1.0 μm thick coating of a nickel-phosphorus alloy was formed on the surface of a wristwatch case of brass according to the electroless nickel-phosphorus alloy plating process in the same manner as in Example 9.

Subsequently, a 0.5 μm thick coating of chromium as another metal undercoating was formed on the nickel-phosphorus alloy coating according to a wet plating process. The employed plating bath composition and plating conditions were as follows:

Chromium plating

| Plating bath composition | |
| --- | --- |
| chromic anhydride | 240 to 270 g/liter |
| sulfuric acid | 2 to 3 g/liter |
| trivalent chromium | 3 to 4 g/liter |
| Plating conditions | |
| bath temperature | 40 to 55° C. |
| current density | 30 to 40 A/dm² |

Subsequently, the resultant wristwatch case was placed in an ion plating apparatus. The interior of the apparatus was evacuated to a pressure of $1.0 \times 10^{-5}$ Torr, and argon gas was introduced thereinto to a pressure of $3 \times 10^{-3}$ Torr.

Then, a thermionic filament and a plasma electrode arranged in the apparatus were operated to generate argon plasma. Simultaneously, a voltage of −50 V was applied to the wristwatch case as a substrate, and bombardment cleaning was performed for 10 min.

The introduction of argon gas was halted, and nitrogen gas was introduced into the apparatus to a pressure of $1.0 \times 10^{-3}$ Torr. A plasma gun disposed in the apparatus was operated to generate plasma, and Ti was evaporated for 10 min, thereby forming a 0.5 μm thick coating of a Ti nitride having a nitrification degree of 0.2 in terms of the above defined x on the surface of the chromium coating. Thereafter, the interior of the apparatus was evacuated to a pressure of $1.0 \times 10^{-5}$ Torr.

Then, argon gas was introduced into the apparatus to a pressure of $1.0 \times 10^{-3}$ Torr, and plasma was generated. A gold-nickel mixture composed of 55 atomic % of gold and 45 atomic % of nickel was evaporated until a gold-nickel alloy coating having a thickness of 0.3 μm was formed.

The thus obtained wristwatch case had a uniform white tone of high lightness and warmth.

The outermost coating of the obtained wristwatch case was analyzed by X-ray photoelectron spectroscopy, and it was found that the outermost coating was composed of 63 atomic % of gold and 37 atomic % of nickel.

A 0.5 to 1.0 μm thick coating of a nickel-phosphorus alloy, a 0.5 μm thick coating of chromium, a 0.5 μm thick coating of a Ti nitride and a 0.3 μm thick coating of a gold-nickel alloy in this order were formed on a brass plate in the same manner as described above, except that the brass plate composed of brass of the same quality as that of the brass composing the above wristwatch case was used in place of the wristwatch case. The lightness (L*) of the white tone thereof was measured.

The L* of the white tone was 65.

EXAMPLE 11

A wristwatch case of stainless steel was washed with an organic solvent and disposed in an ion plating apparatus. Subsequently, the interior of the apparatus was evacuated to a pressure of $1.0 \times 10^{-5}$ Torr, and argon gas was introduced thereinto to a pressure of $3 \times 10^{-3}$ Torr. Then, a thermionic filament and a plasma electrode arranged in the apparatus were operated to generate argon plasma. Simultaneously, a voltage of −50 V was applied to the wristwatch case as a substrate, and bombardment cleaning was performed for 10 min.

The introduction of argon gas was halted, and nitrogen gas was introduced into the apparatus to a pressure of $1.0 \times 10^{-3}$ Torr. Ti was evaporated for 10 min, thereby forming a 0.5 μm thick coating of a Ti nitride having a nitrification degree of 0.2 on the surface of the wristwatch case. Thereafter, the interior of the apparatus was evacuated to a pressure of $1.0 \times 10^{-5}$ Torr.

Then, argon gas was introduced into the apparatus to a pressure of $1.0 \times 10^{-3}$ Torr, and plasma was generated. A gold-titanium mixture composed of 40 atomic % of gold and 60 atomic % of titanium was evaporated until a gold-titanium coating having a thickness of 0.3 μm was formed. The thus obtained wristwatch case was highly light. This wristwatch case was assembled with other wristwatch parts to obtain a wristwatch. This wristwatch was worn for 90 days, precisely for a total of 1080 hours, but allergic dermatitis did not occur at all.

The outermost coating of the obtained wristwatch case was analyzed by X-ray photoelectron spectroscopy, and it was found that the outermost coating was composed of 60 atomic % of gold and 40 atomic % of titanium.

A 0.5 μm thick coating of a Ti nitride and thereupon a 0.3 μm thick gold-titanium coating were formed on a stainless steel plate in the same manner as described above, except that the stainless steel plate composed of stainless steel of the same quality as that of the stainless steel composing the above wristwatch case was used in place of the wristwatch case. The lightness of the white tone thereof was measured.

The L* of the white tone was 60.

EXAMPLE 12

A wristwatch case of stainless steel was washed with an organic solvent and disposed in an ion plating apparatus. Subsequently, the interior of the apparatus as evacuated to a pressure of $1.0 \times 10^{-5}$ Torr, and argon gas was introduced thereinto to a pressure of $3 \times 10^{-3}$ Torr. Then, a thermionic filament and a plasma electrode arranged in the apparatus were operated to generate argon plasma. Simultaneously, a voltage of –50 V was applied to the wristwatch case as a substrate, and bombardment cleaning was performed for 10 min.

The introduction of argon gas was halted, and ethylene gas was introduced into the apparatus to a pressure of $2.0 \times 10^{-3}$ Torr. Ti was evaporated for 10 min, thereby forming a 0.5 μm thick coating of a Ti carbide having a carbonization degree of 0.3 on the surface of the wristwatch case. Thereafter, the interior of the apparatus was evacuated to a pressure of $1.0 \times 10^{-5}$ Torr.

Then, argon gas was introduced into the apparatus to a pressure of $1.0 \times 10^{-3}$ Torr, and plasma was generated. A gold-iron mixture composed of 55 atomic % of gold and 45 atomic % of iron was evaporated until a gold-iron coating having a thickness of 0.3 μm was formed. The thus obtained wristwatch case was highly light. This wristwatch case was assembled with other wristwatch parts to obtain a wristwatch. This wristwatch was worn for 90 days, precisely for a total of 1080 hours, but allergic dermatitis did not occur at all.

The outermost coating of the obtained wristwatch case was analyzed by X-ray photoelectron spectroscopy, and it was found that the outermost coating was composed of 63 atomic % of gold and 37 atomic % of iron. A 0.5 μm thick coating of a Ti carbide and thereupon a 0.3 μm thick gold-iron coating were formed on a stainless steel plate in the same manner as described above, except that the stainless steel plate composed of stainless steel of the same quality as that of the stainless steel composing the above wristwatch case was used in place of the wristwatch case. The lightness of the white tone thereof was measured.

The L* of the white tone was 65.

EXAMPLE 13

A wristwatch case of brass was washed with an alkali and neutralized with an acid. Then, a 4 μm thick coating of a copper-tin alloy, a 3 μm thick coating of a copper-tin-palladium alloy and a 0.5 μm thick palladium coating in this order were formed as metal undercoatings on the surface of the wristwatch case. From the viewpoint of achieving mass-production, the optimum thicknesses of the copper-tin alloy, copper-tin-palladium alloy and palladium coatings preferably range from 2 to 6 μm, from 2 to 4 μm and from 0.3 to 1 μm, respectively. Especially, when the thicknesses are below the above lower limits, the problem of corrosion is likely to occur. On the other hand, when the above upper limits are exceeded, the problems of productivity and cost are likely to occur. Although three metal undercoatings are employed above, one or two metal undercoatings may also be suitable. One, two or three metal undercoatings are employed depending on the environment of the use of the final wristwatch, etc. That is, when the corrosion resistance is especially important, three metal undercoatings are employed. On the other hand, when the corrosion resistance is not so important, one or two metal undercoatings are used. The adhesion with the white hard coating superimposed thereupon is good irrespective of one, two or three metal undercoatings.

Subsequently, this wristwatch case was disposed in an ion plating apparatus. The interior of the apparatus was evacuated to a pressure of $1.0 \times 10^{-5}$ Torr, and argon gas was introduced thereinto to a pressure of $3 \times 10^{-3}$ Torr. Then, a thermionic filament and a plasma electrode arranged in the apparatus were operated to generate argon plasma. Simultaneously, a voltage of –50 V was applied to the wristwatch case as a substrate, and bombardment cleaning was performed for 10 min. The introduction of argon gas was halted, and nitrogen gas was introduced into the apparatus to a pressure of $1.0 \times 10^{-3}$ Torr. Ti was evaporated for 10 min, thereby forming a 0.5 μm thick coating of a Ti nitride having a nitrification degree of 0.2 on the surface of the wristwatch case. Thereafter, the interior of the apparatus was evacuated to a pressure of $1.0 \times 10^{-5}$ Torr.

Then, argon gas was introduced into the apparatus to a pressure of $1.0 \times 10^{-3}$ Torr, and plasma was generated. A gold-titanium mixture composed of 40 atomic % of gold and 60 atomic % of titanium was evaporated until a gold-titanium coating having a thickness of 0.3 μm was formed. The thus obtained wristwatch case was highly light. This wristwatch case was assembled with other wristwatch parts to obtain a wristwatch. This wristwatch was worn for 90 days, precisely for a total of 1080 hours, but allergic dermatitis did not occur at all.

The outermost coating of the obtained wristwatch case was analyzed by X-ray photoelectron spectroscopy, and it was found that the outermost coating was composed of 60 atomic % of gold and 40 atomic % of titanium. A 0.5 μm thick coating of a Ti nitride and thereupon a 0.3 μm thick gold-titanium coating were formed on a brass plate in the same manner as described above, except that the brass plate composed of brass of the same quality as that of the brass composing the above wristwatch case was used in place of the wristwatch case. The lightness of the white tone thereof was measured.

The L* of the white tone was 60.

We claim:

1. A white decorative part comprising:
    a substrate,
    a white hard coating formed on the substrate according to a dry plating process, and an outermost coating formed on the white hard coating according to a dry plating process, wherein the white hard coating comprises titanium nitride represented by $TiN_x$ where x is a nitrification degree of about 0.05 to 0.40, and the outermost coating comprises a gold-iron alloy in which the proportion of the gold in the outermost coating ranges from about 30 to 80 atomic %.

2. The white decorative part as claimed in claim 1, wherein the gold-iron alloy comprising the outermost coating is an alloy of gold and at least one of a nitride, a carbide, an oxide and a carbonitride of iron.

3. The white decorative part as claimed in claim 1, wherein the outermost coating is one formed by a process selected from the group consisting of ion plating, sputtering and vacuum evaporation.

4. A white decorative part comprising:

a substrate, a metal undercoating formed on the substrate according to a wet plating process, a white hard coating formed on the metal undercoating according to a dry plating process, and an outermost coating formed on the white hard coating according to a dry plating process, wherein the white hard coating comprises titanium nitride represented by $TiN_x$ where x is a nitrification degree of about 0.05 to 0.40, and the outermost coating comprises a gold-iron alloy in which the proportion of the gold in the outermost coating ranges from about 30 to 80 atomic %.

5. The white decorative part as claimed in claim 4, wherein the gold-iron alloy comprising the outermost coating is an alloy of gold and at least one of a nitride, a carbide, an oxide and a carbonitride of iron.

6. The white decorative part as claimed in claim 4, wherein the metal undercoating is at least one coating selected from the group consisting of a nickel alloy coating, a nickel coating, a chromium coating, a palladium coating, a laminate of nickel alloy and chromium coatings, a laminate of nickel and chromium coatings, a laminate of nickel alloy and palladium coatings, a laminate of nickel and palladium coatings, a copper-tin alloy coating and a copper-tin-palladium alloy coating.

7. The white decorative part as claimed in claim 4, wherein the outermost coating is formed by a process selected from the group consisting of ion plating, sputtering and vacuum evaporation.

8. A process for producing a white decorative part, comprising the steps of:

evaporating titanium in an atmosphere of nitrogen gas in a dry plating apparatus to thereby form a white hard coating comprising titanium nitride represented by $TiN_x$ where x is a nitrification degree of about 0.05 to 0.40 on a substrate, and evaporating in the dry plating apparatus a gold-iron alloy or mixture in an atmosphere of argon gas to thereby form an outermost coating in which the proportion of the gold ranges from 30 to 80 atomic % on the hard white coating.

9. A process for producing a white decorative part, comprising the steps of:

forming a metal undercoating on a substrate according to a wet plating process, evaporating titanium in an atmosphere of nitrogen gas in a dry plating apparatus to thereby form a white hard coating comprising titanium nitride represented by $TiN_x$ where x is a nitrification degree of about 0.05 to 0.40 on the metal undercoating, and evaporating in the dry plating apparatus a gold-iron alloy or mixture in an atmosphere of argon gas to thereby form an outermost coating in which the proportion of the gold ranges from 30 to 80 atomic % on the white hard coating.

* * * * *

UNITED STATES PATENT AND TRADEMARK OFFICE
CERTIFICATE OF CORRECTION

PATENT NO. : 5,985,469
DATED : November 16, 1999
INVENTOR(S) : Ryo Kurakata et al.

It is certified that error appears in the above-identified patent and that said Letters Patent is hereby corrected as shown below:

Column 6 Line 33 "pH   11   4 to 5" should read --pH   4 to 5-- (delete "11").

Signed and Sealed this

Twenty-sixth Day of December, 2000

Attest:

Q. TODD DICKINSON

*Attesting Officer*   *Director of Patents and Trademarks*